(12) United States Patent
Matsuyama et al.

(10) Patent No.: US 7,968,430 B2
(45) Date of Patent: Jun. 28, 2011

(54) COMPOUND SEMICONDUCTOR DEVICE AND METHOD FOR MANUFACTURING SAME

(75) Inventors: Takayuki Matsuyama, Kanagawa-ken (JP); Tadaaki Hosokawa, Kanagawa-ken (JP); Seiji Iida, Kanagawa-ken (JP); Akira Tanaka, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 11 days.

(21) Appl. No.: 11/850,377

(22) Filed: Sep. 5, 2007

(65) Prior Publication Data

US 2008/0061303 A1    Mar. 13, 2008

(30) Foreign Application Priority Data

Sep. 6, 2006    (JP) .................................. 2006-241937

(51) Int. Cl.
 *H01L 21/00*    (2006.01)
(52) U.S. Cl. .......... 438/460; 438/462; 438/463; 438/33; 257/E21.238
(58) Field of Classification Search ........... 257/E21.238, 257/79, 594; 438/462, 463, 460, 33, 42, 438/43, 46, 718, 736
See application file for complete search history.

(56) References Cited

U.S. PATENT DOCUMENTS

| 5,852,624 | A | 12/1998 | Matsuyama et al. | |
|---|---|---|---|---|
| 6,379,985 | B1 | 4/2002 | Cervantes et al. | |
| 6,699,774 | B2 | 3/2004 | Takyu et al. | |
| 7,041,523 | B2 | 5/2006 | Kawakami et al. | |
| 7,183,585 | B2 | 2/2007 | Kuramoto | |
| 2003/0029836 | A1* | 2/2003 | Lindstrom et al. | 216/67 |
| 2004/0191942 | A1* | 9/2004 | Kawakami et al. | 438/33 |
| 2005/0093009 | A1* | 5/2005 | Kuramoto | 257/98 |
| 2005/0181527 | A1* | 8/2005 | Ohno et al. | 438/33 |
| 2007/0093041 | A1* | 4/2007 | Tanaka et al. | 438/463 |

FOREIGN PATENT DOCUMENTS

| EP | 1610364 A1 * | 12/2005 |
|---|---|---|
| JP | 2005-136093 | 5/2005 |

* cited by examiner

*Primary Examiner* — A. Sefer
*Assistant Examiner* — Ermias Woldegeorgis
(74) *Attorney, Agent, or Firm* — Oblon, Spivak, McClelland, Maier & Neustadt, L.L.P.

(57) ABSTRACT

A compound semiconductor device includes a laminated body including a crystal substrate and a compound semiconductor multilayer film. The laminated body has a major surface, a first side face, a second side face, a third side face, and a fourth side face. The first and the second side faces are opposed to each other, substantially perpendicular to the major surface of the laminated body, made of cleaved surfaces. The third and the fourth side faces are perpendicular to the major surface and to the first and the second side faces, opposed to each other, and made of uncleaved surfaces. A groove is provided on the third side face, and the groove has a depth varied with position as viewed from the major surface, and has ends not reaching the first and second side face.

16 Claims, 11 Drawing Sheets

COMPOUND SEMICONDUCTOR DEVICE AND METHOD FOR MANUFACTURING SAME

CROSS-REFERENCE TO RELATED APPLICATIONS

This application is based upon and claims the benefit of priority from the prior Japanese Patent Application No. 2006-241937, filed on Sep. 6, 2006; the entire contents of which are incorporated herein by reference.

BACKGROUND OF THE INVENTION

1. Field of the Invention

This invention relates to a compound semiconductor device and a method for manufacturing the same.

2. Background Art

Among compound semiconductors, nitride semiconductors have wide bandgap, and have greater electron saturation velocity than GaAs. Hence nitride semiconductors find widespread application in semiconductor light emitting apparatuses, high-frequency devices, and high-power switching devices.

In crystal growth for a nitride semiconductor device, GaN (gallium nitride), sapphire, and SiC (silicon carbide) substrates are used. These substrates have greater Young's modulus, and hence are harder, than GaAs and InP substrates. Furthermore, because of their hexagonal crystal structure, their cleavage directions are not orthogonal. For this reason, the process for separation into individual rectangular devices is more difficult than for other semiconductor materials.

JP-A 2005-136093(Kokai) discloses a method for separating rectangular devices where the needle tip of the scriber is made of diamond and scribe grooves are selectively formed on a bar-shaped semiconductor surface. In this method, an uncleaved surface occurs along the scribe groove, and a cleaved surface occurs in the region free from the scribe groove. Hence, by forming a scribe groove inside, an uncleaved surface is formed in the inner portion of the device side face, and a cleaved surface is formed in the outer portion of the device side face. Consequently, the device side face has a cleaved surface and an uncleaved surface. Thus an automatic assembling process is more difficult to implement, and processing residue occurring in the scribe process is not sufficiently reduced.

On the other hand, use of a YAG laser is also contemplated instead of scribing. However, increasing the laser power for separation with high yield may result in increasing debris, i.e., processing residue due to laser irradiation. It is necessary to reduce such debris for ensuring the reliability of semiconductor light emitting apparatuses.

SUMMARY OF THE INVENTION

According to an aspect of the invention, there is provided a compound semiconductor device including a laminated body including a crystal substrate and a compound semiconductor multilayer film, the laminated body having a major surface, a first side face, a second side face, a third side face, and a fourth side face, the first and the second side faces being opposed to each other, the first and the second side faces being substantially perpendicular to the major surface of the laminated body, and the first and the second side faces being made of cleaved surfaces, the third and the fourth side faces being perpendicular to the major surface and to the first and the second side faces, the third and the fourth side faces being opposed to each other, and the third and the fourth side faces being made of uncleaved surfaces, and a groove being provided on the third side face, the groove having a depth varied with position as viewed from the major surface, and the groove having ends not reaching the first and second side face.

According to another aspect of the invention, there is provided a compound semiconductor device including a laminated body including a crystal substrate and a multilayer film including a light emitting section made of GaN-based material, the laminated body having a major surface, a first side face, a second side face, a third side face, and a fourth side face, the first side face and the second side face being opposed to each other, the first side face and the second side face being substantially perpendicular to the major surface of the laminated body, the first side face and the second side face being made of cleaved surfaces, the third side face and the fourth side face being perpendicular to the major surface and to the first and the second side faces, the third side face and the fourth side face being opposed to each other, and the third side face and the fourth side face being made of uncleaved surfaces, and a groove being provided on the third side face, the groove having a depth varied with position as viewed from the major surface, and the groove having ends not reaching the first and second side face.

According to another aspect of the invention, there is provided a method for manufacturing a compound semiconductor device, including: cleaving a laminated body including a crystal substrate and a compound semiconductor multilayer film for separation into bars; forming a groove on a major surface of the bar by laser irradiation, the groove extending substantially perpendicular to the cleaved surface of the bar, not reaching the cleaved surface, and having a depth from the major surface varied with position; and separating the bar along the groove.

BRIEF DESCRIPTION OF THE DRAWINGS

FIG. 2 is a view illustrating a method for manufacturing an example of the invention.

FIG. 3 is a view illustrating a method for manufacturing an example of the invention.

FIG. 4 is a view illustrating a method for manufacturing an example of the invention.

FIG. 8 is a view illustrating debris in case the groove does not penetrate the cleaved surfaces and FIG. 8A is a schematic plan view.

FIG. 9 is a view illustrating debris in case the groove penetrates the cleaved surfaces and FIG. 9A is a schematic plan view.

DETAILED DESCRIPTION OF THE INVENTION

An embodiment of the invention will now be described with reference to the drawings.

Figure 1:
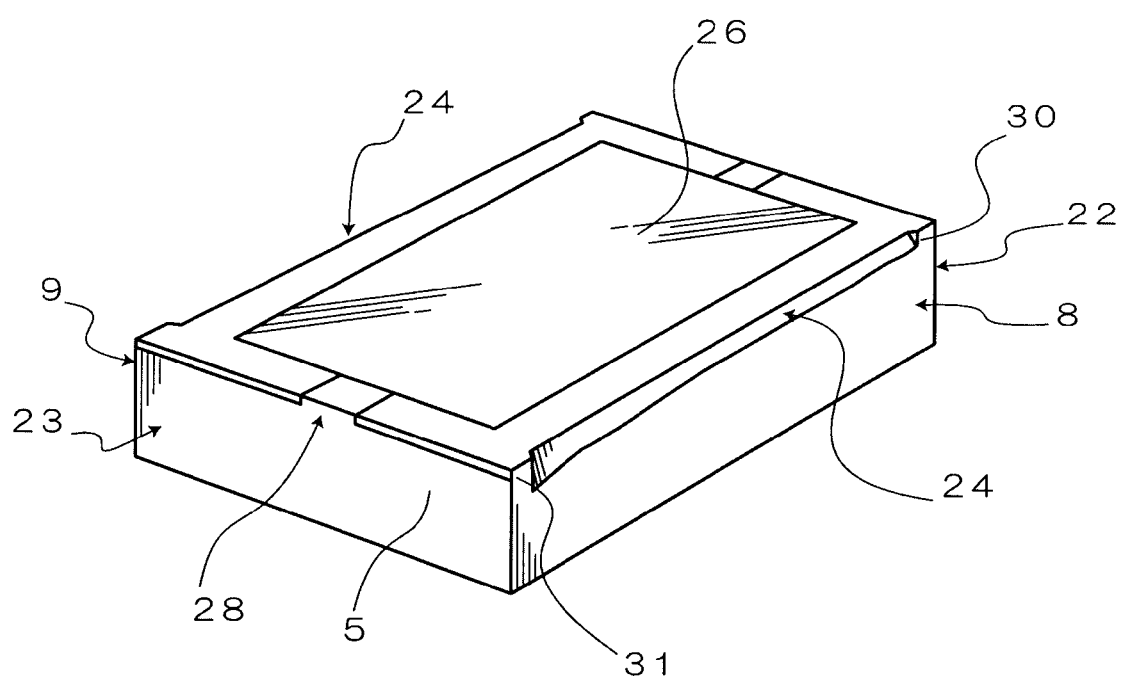
FIG. 1 is a schematic perspective view of a compound semiconductor device according to an example of the invention.

FIG. 1 is a schematic perspective view of a compound semiconductor device according to an example of the invention.

A laminated body 5 includes a crystal substrate of GaN and a compound semiconductor multilayer film formed thereon by crystal growth. One major surface of the laminated body 5 is provided with a ridge stripe 28 and a pad electrode 26. Cleaved surfaces 22 and 23 are opposed to each other and perpendicular to the one major surface of the laminated body 5. Side faces 8 and 9, being perpendicular to the one major surface of the laminated body 5 and to the cleaved surfaces 22 and 23 and being opposed to each other, are made of uncleaved surfaces. The side faces 8 and 9 are provided with a groove 24 for separation, where the depth of the groove 24 as viewed from the one major surface is varied with position, and the ends of the groove 24 do not reach the cleaved surfaces 22 and 23.

Figure 11:
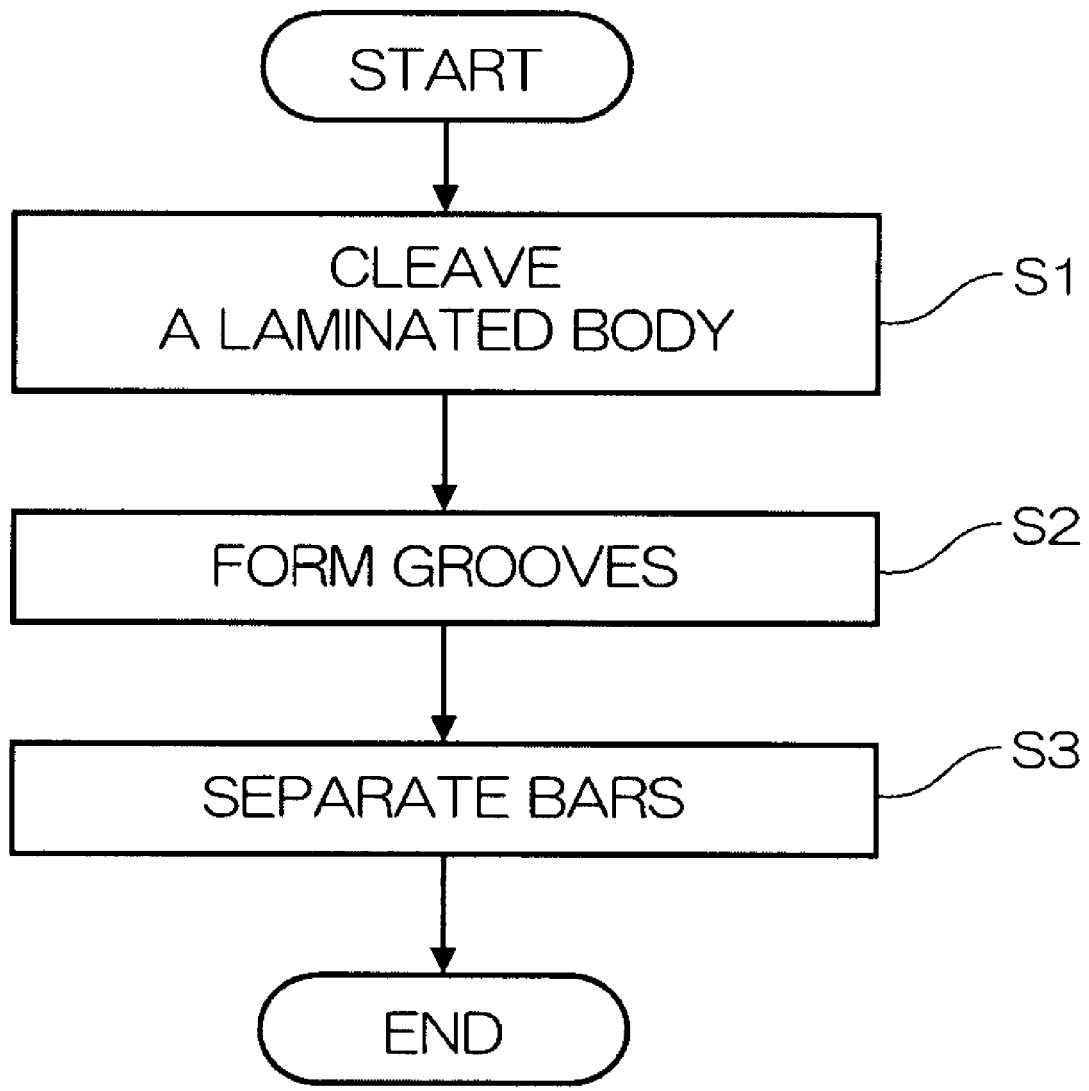
FIG. 11 is a flow chart showing a method for manufacturing a compound semiconductor device according to an example of the invention.

FIGS. 2 to 4 are schematic views showing the main part of a method for manufacturing a compound semiconductor device according to the example of the invention. FIG. 11 is a flow chart showing a method for manufacturing a compound semiconductor device according to an example of the invention. In the following, a semiconductor laser device is described by way of example. However, the invention is not limited thereto.

Figure 2A:
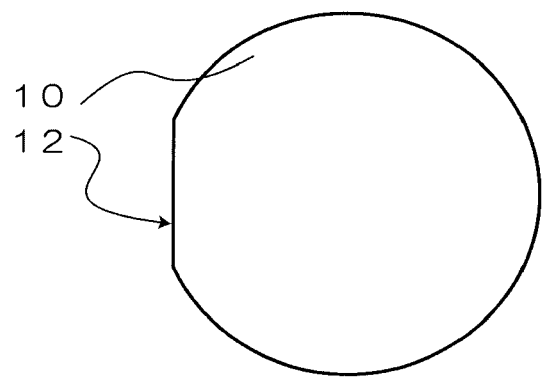
FIG. 2A is a view showing GaN substrate.

FIG. 2A is a schematic plan view showing a GaN substrate 10 with its surface being formed of (0001) plane. It has an orientation flat (OF) 12 for determining the crystal plane orientation.

Figure 2B:
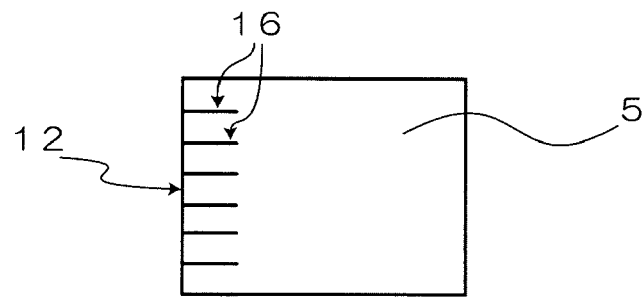
FIG. 2B is a view showing the laminated body of scribed grooves and FIG. 2C is a view showing separated bars.

On one major surface of the GaN substrate 10, a multilayer film of compound semiconductors is crystal grown to form a laminated body. After completion of the wafer process, as illustrated in FIG. 2B, the laminated body 5 is formed into a rectangular shape with reference to the orientation flat 12. A scriber equipped with a diamond needle is used to form scribe grooves 16 on the laminated body 5 along the orientation flat 12. The spacing therebetween can be set to 300 to 1000 micrometers.

Figure 2C:
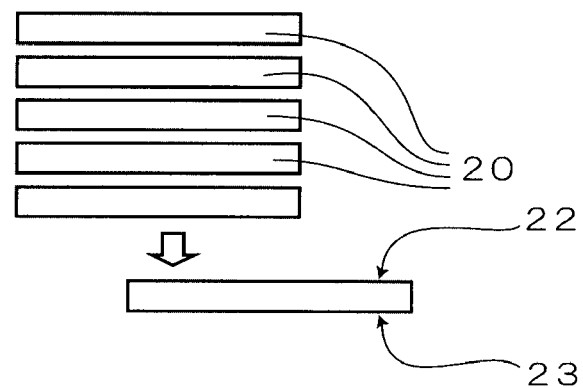

FIG. 2C shows the rectangular laminated body 5 being separated into bars 20 by cleavage starting at the scribe grooves 16. In the case of semiconductor laser devices, the cleaved surface 22 serves as a mirror and constitutes an optical resonator. If necessary, the cleaved surfaces 22, 23 are provided with reflection coatings. For example, the cleaved surface 22 can be provided with a high reflection coating, whereas the cleaved surface 23 can be provided with a low reflection coating.

Figure 3A:
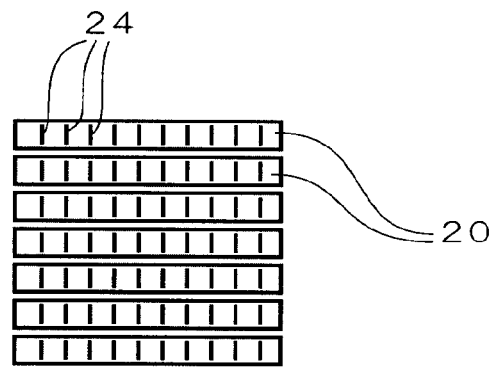
FIG. 3A is a separated grooved bar and FIG. 3B is a partial enlarged plan view of FIG. 3A.
Figure 3B:
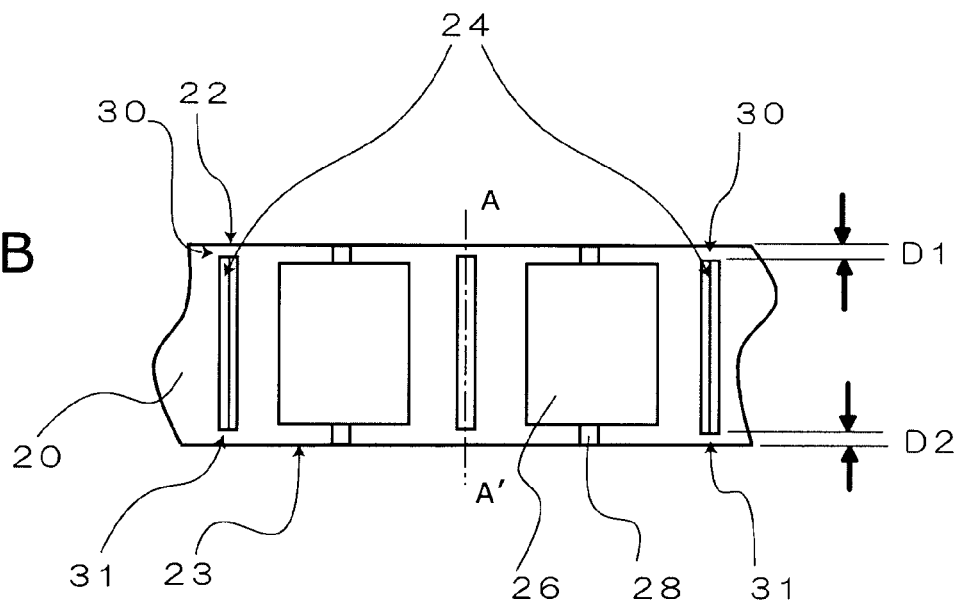

Subsequently, as illustrated in FIG. 3A, grooves 24 in accordance with the width of the device are formed by YAG laser irradiation for separation into individual devices. FIG. 3B is a schematic enlarged plan view thereof. Electrode pads 26 are formed on the surface of the bar 20, and a ridge stripe 28 including a light emitting section is provided below the electrode pad 26. The groove 24 is provided almost midway between the ridge stripes 28. This example includes a groove non-formation region 30, which is a region with spacing D1 provided between one end of the groove 24 and the cleaved surface 22. Similarly, this example includes a groove non-formation region 31, which is a region with spacing D2 provided between the other end of the groove 24 and the cleaved surface 23. D1 and D2 are preferably more than 0 and not more than 20 micrometers. The non-formation region of more than 20 micrometers is too large, and hence may cause a cleaved surface partially on the separated device side face, or may cause cracking and chipping.

Figure 4A:
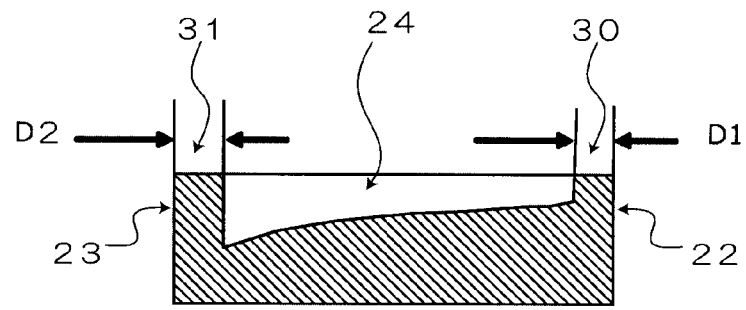
FIG. 4A is a schematic cross-sectional view of the groove.
Figure 4B:
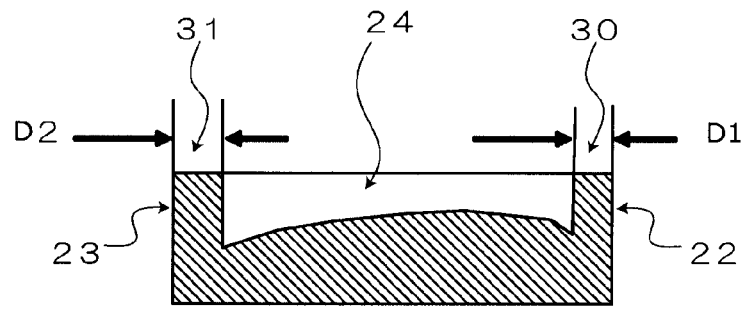
FIG. 4B is a schematic cross-sectional view of the other grooves and FIG. 4C is a schematic cross-sectional view that a blade is applied to the backside.

FIGS. 4A and 4B show schematic cross-sectional views taken along the dot-dashed line AA' in FIG. 3B. First, in FIG. 4A, the groove 24 is provided so that its depth is large on the groove non-formation region 31 side and gradually decreases toward the groove non-formation region 30 side. For example, this depth can be set to 40 micrometers at the deepest portion and 20 micrometers at the shallowest portion. In FIG. 4B, the depth of the groove 24 is large on the groove non-formation region 31 side, gradually decreases toward the center, and then gradually increases again. The depths of the groove 24 at both ends may be equal or different. The depth only needs to be varied. Hence the groove 24 may be deep in the vicinity of the center and shallow at both ends. The stress concentration effect of the groove 24 is enhanced as the depth ratio between the deepest portion and the shallowest portion increases. Thus the ratio is preferably twice or more. The width of the groove 24 can be in the range of 5 to 15 micrometers, for example.

Figure 4C:
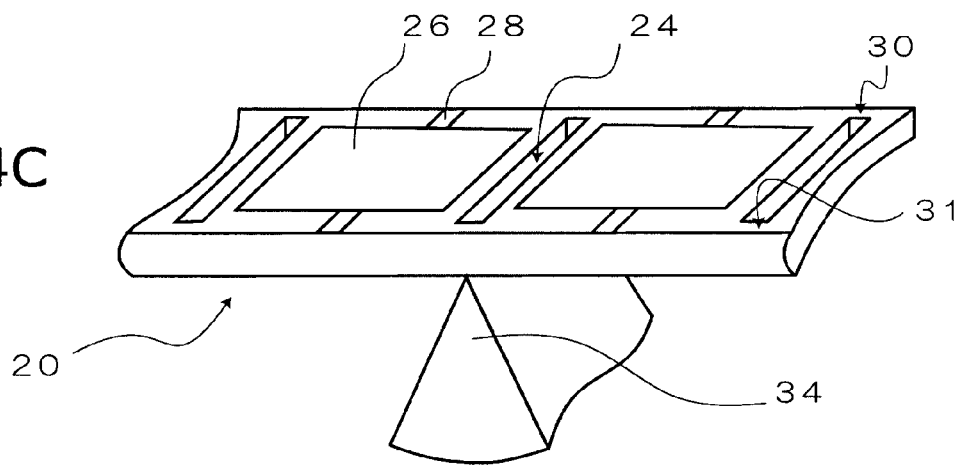

Subsequently, as illustrated in FIG. 4C, a ceramic or other separating blade 34 is applied to the backside of the bar 20 for breaking, and device separation is completed. This allows device separation without depending on the crystal plane orientation even for very hard GaN-based materials having non-orthogonal cleaved surfaces. On the contrary, if a scriber apparatus equipped with a diamond needle is used for the device separation process, the diamond needle is subjected to severe abrasion, causing irregularity in device shape, which often results in insufficient device separation yield. It should be noted that the two outermost devices on both ends of the bar 20 do not need grooves 24 on the outer side face. That is, in this case, a groove 24 is formed on only one of the side faces 8 and 9 in FIG. 1.

Next, a description is given of the laser light power dependence of the processing depth of the groove 24 resulting from YAG laser irradiation for forming the groove 24. Preferably, the YAG laser light has high peak power.

Figure 5:
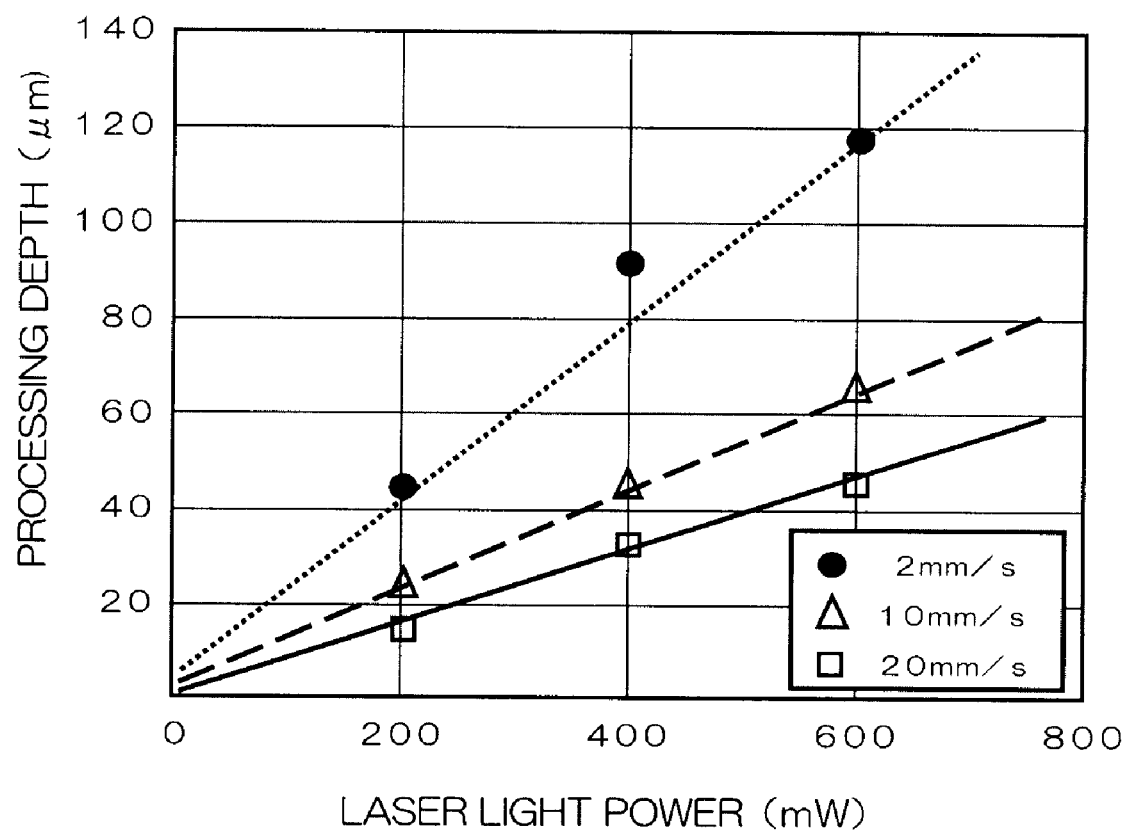
FIG. 5 is a graph showing the experimental result of the laser light power dependence of the processing depth of the groove.

FIG. 5 shows the experimental result. The vertical axis represents processing depth (μm), and the horizontal axis represents laser light power (mW). The sweep rate of the laser beam is used as a parameter, which is set to 2, 10, and 20 mm/s. The processing depth increases nearly in proportion to the laser light power. The processing depth also increases as the sweep rate decreases. Lower laser light power is preferable for preventing debris formation. For increasing the processing depth, decreasing the sweep rate is preferable. However, low sweep rate results in low productivity. Hence it is important to select an appropriate condition by taking these factors into consideration.

In the present example, the groove 24 has a varied depth. In this case, equivalent stress concentrates on the deep portion of the groove 24, which allows device separation with a lower equivalent stress. According to the invention, it has been found that separation can be well performed using the groove 24 having a cross-sectional profile as in FIG. 4A with the deepest portion being 40 micrometers and the shallowest portion being 20 micrometers. The laser light power can be set to 200 mW or less, 360 mW or less, and 500 mW or less for a sweep rate of 2 mm/s (millimeters per second), 10 mm/s, and 20 mm/s, respectively.

Next, the laser light power dependence of the yield of device separation is described.

Figure 6:
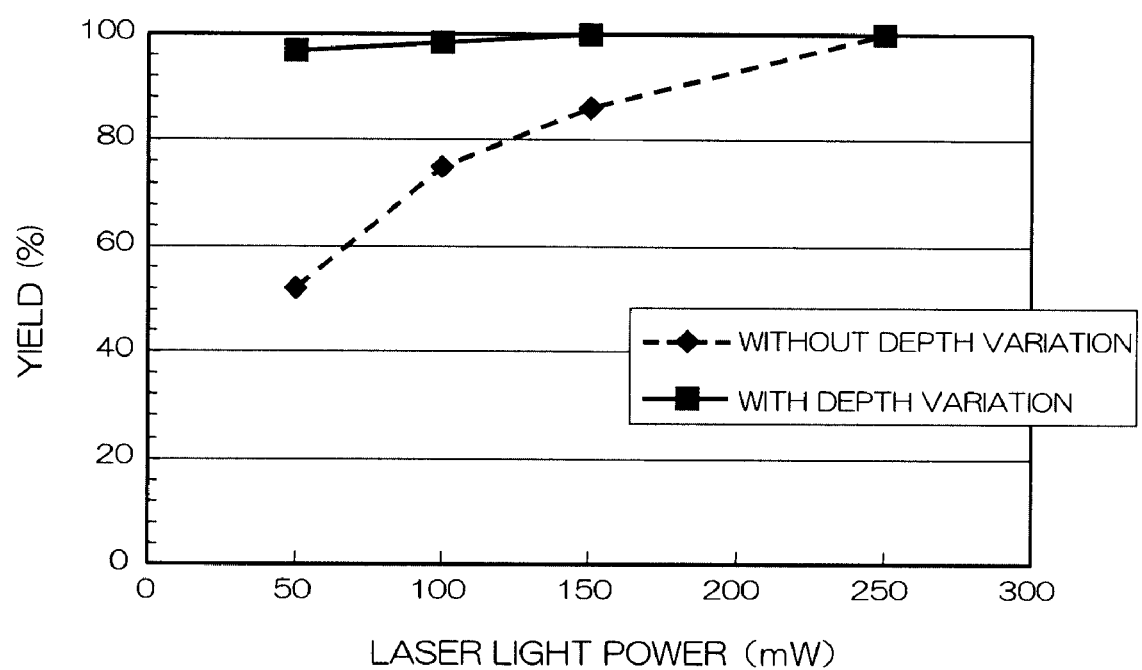
FIG. 6 is a graph showing the experimental result of the laser light power dependence of the yield of device separation.

FIG. 6 is a graph showing the experimental result.

In device separation, if the separation surface has an irregular configuration including a flat or curved surface different from the plane containing the groove 24, transfer or fixation of the device may be made difficult in the subsequent automatic assembling process. The devices having such a separation surface are responsible for decreasing the yield. In FIG. 6, the dashed line represents the case of a groove without depth variation, where a laser light power of 250 mW or more was required for achieving a yield of 99% or more. On the other hand, the solid line represents the case of a groove as in FIG. 4A with D1=D2=20 μm, the deepest portion being 40 μm, and the shallowest portion being 20 μm, where a yield of 99% was achieved with a laser light power of 100 mW.

As illustrated in FIG. 6, device separation yield can be increased without the depth variation of the groove if the laser light power is increased. However, this results in increasing processing residue or debris, and hence is undesirable.

Figure 7A:
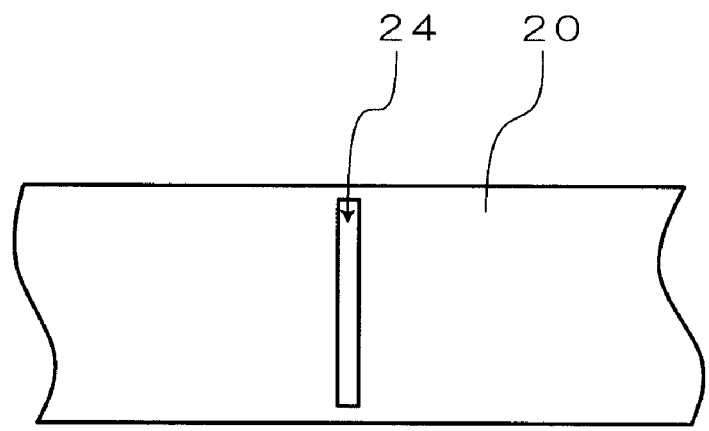
FIG. 7 is a view illustrating debris, where the laser light power is 100 mW in FIG. 7A and 250 mW in FIG. 7B.
Figure 7B:
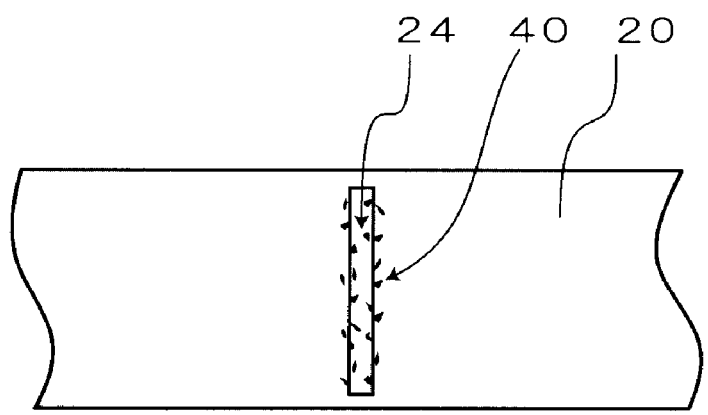

FIG. 7 is a schematic plan view illustrating debris, where the laser light power is 100 mW in FIG. 7A and 250 mW in FIG. 7B. In FIG. 7A, debris formation is prevented because of the low laser light power. On the other hand, in FIG. 7B for the high laser light power, processing residue or debris 40 formed by oxidation of Ga resulting from thermal decomposition of GaN occurs in the vicinity of the groove 24.

Next, a description is given of the fact that the groove non-formation regions 30, 31 can prevent the formation of debris 40 on the cleaved surfaces 22 and 23.

Figure 8A:
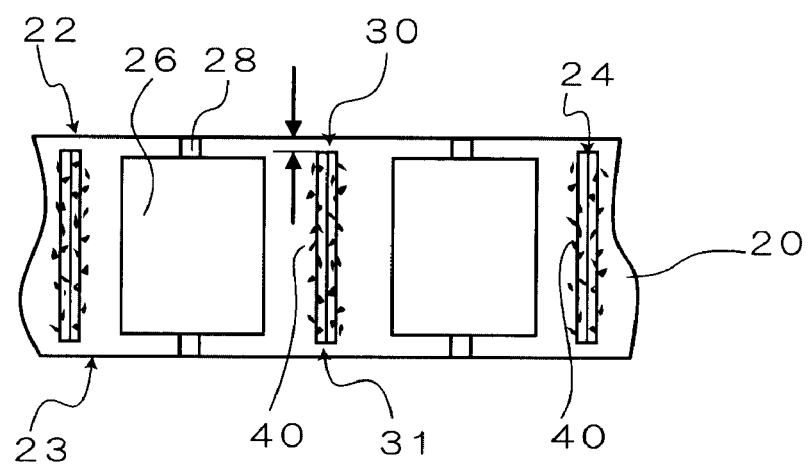
Figure 8B:
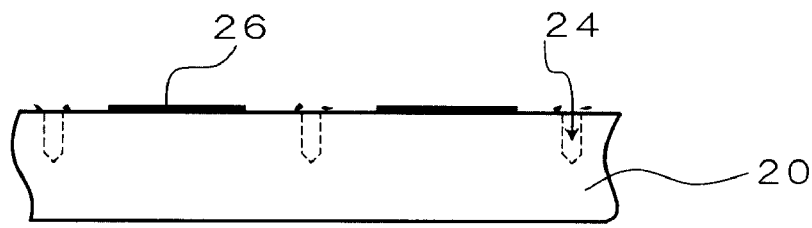
FIG. 8B is a schematic cross-sectional view.

FIG. 8 shows the case with groove non-formation regions 30 and 31, where FIG. 8A is a schematic plan view and FIG. 8B is a schematic cross-sectional view. The cleaved surfaces 22 and 23 are not directly contiguous to the groove 24, and hence are free from debris. In this case, even if the laser light power exceeds 100 mW and causes debris 40 in the vicinity of the separation groove 24, attachment of the debris 40 to the cleaved surfaces 22 and 23 can be prevented because the groove 24 is not directly contiguous to the cleaved surfaces 22 and 23.

Figure 9A:
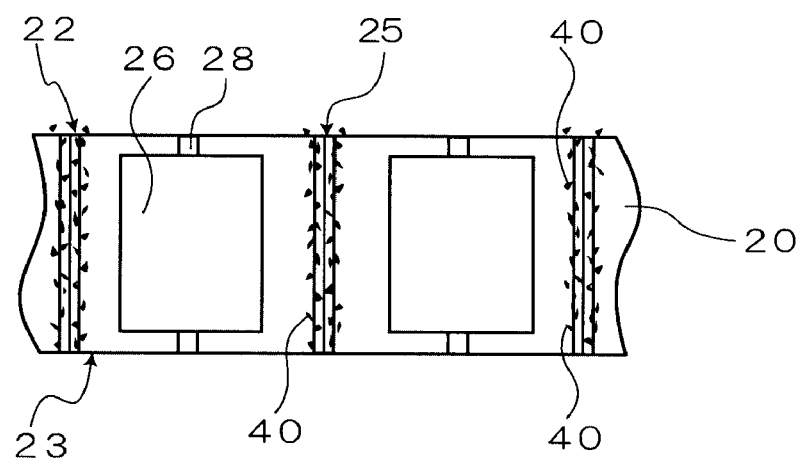
Figure 9B:
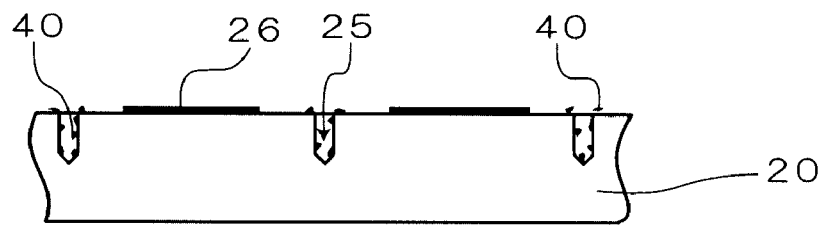
FIG. 9B is a schematic cross-sectional view.

FIG. 9 shows a comparative example without groove non-formation regions.

In this case, the groove 25 is contiguous to the cleaved surfaces 22 and 23. Consequently, it is more likely that processing residue due to laser irradiation is directly attached to the cleaved surfaces 22 and 23 and causes debris 40. For example, if the laser light power exceeds 100 mW, debris 40 occurs also on the cleaved surfaces 22 and 23, and the debris 40 increases as the laser light power increases. Because the cleaved surfaces 22 and 23 constitute the mirror surfaces of the optical resonator, attachment of soil or foreign matter thereto is undesirable. In particular, a semiconductor laser apparatus with a light power of several hundred mW or more has a high photon density on the cleaved surfaces 22 and 23, and hence soil or foreign matter may accumulate in the vicinity of the light emitting layer.

In the present example, when D1 and D2 are 20 micrometers or less and the maximum depth of the groove 24 is twice or more the minimum depth, the laser light power is preferably in the range of 50 to 100 mW.

In the present example described above, the surface of the semiconductor device can be kept clean because debris 40 can be prevented by reducing the laser light power. Furthermore, the cleaved surfaces 22 and 23, which are not directly contiguous to the separation groove 24, can be kept cleaner. This is particularly desirable for a semiconductor laser apparatus that uses cleaved surfaces for an optical resonator. Consequently, it is possible to provide a semiconductor laser apparatus capable of stable operation over a long time.

These advantageous effects are not limited to semiconductor laser apparatuses. HEMT (high electron mobility transistor) and other electronic devices also have a fine structure in the vicinity of the gate electrode. Hence attachment of debris on the device surface is undesirable, and the present example is also applicable thereto.

Furthermore, in the present example described above, the spacing D1 between the end of the groove 24 and the cleaved surface 22 in the groove non-formed region 30 can be set to be same as the spacing D2 between the end of the groove 24 and the cleaved surface 23 in the groove non-formed region 31. However, the spacing is not limited to this condition and the spacing D1 can differ from the spacing D2.

As shown in FIGS. 4A and 4B, in the present example, the spacing D1 between the end of the groove 24 and the cleaved surface 22 in the groove non-formed region 30 is a little smaller than the spacing D2 between the end of the groove 24 and the cleaved surface 23 in the groove non-formed region 31. And the depth of the groove corresponding to the groove non-formed region 30 is smaller than that to the groove non-formed region 31. It is good for a high yield to configure the spacing D1, corresponding to the small depth groove, small, as shown in FIGS. 4A and 4B, because the laminated body in the groove non-formed region 30 corresponding to the small depth groove becomes hard to be broken. Furthermore, it is able to configure the spacing D2, corresponding to the large depth groove, small. In this case, it is good for expansion of a tolerance in groove forming to configure the spacing D2, corresponding to the small depth groove, large because the laminated body in the groove non-formed region 31 corresponding to the large depth groove becomes easy to be broken.

Figure 10A:
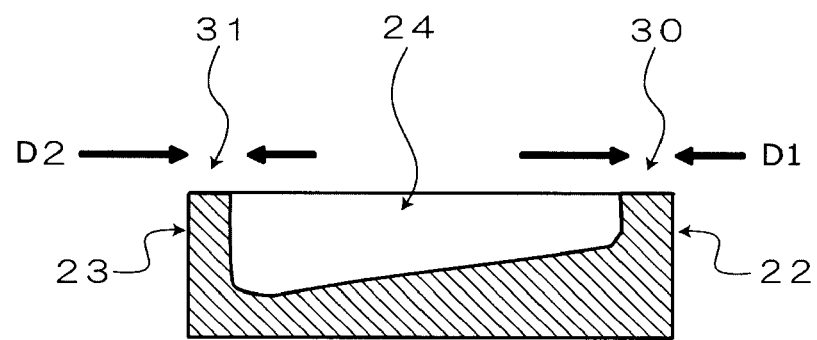
FIGS. 10A and 10B are schematic perspective views of a compound semiconductor device according to other example of the invention.
Figure 10B:
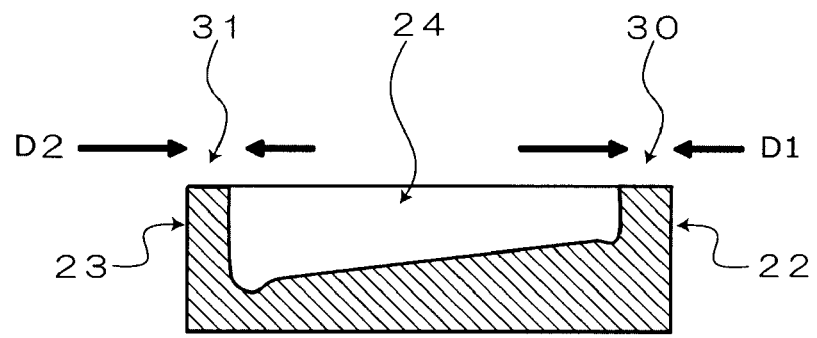

Furthermore, other examples of the invention are explained as follows. FIGS. 10A and 10B are schematic perspective views of a compound semiconductor device according to other example of the invention. The compound semiconductor devices as shown in these figures are modifications of the examples as shown in FIGS. 4A and 4B. As shown in FIG. 10A, the depth of the groove 24 is maximized at a position having a little space from the end of the groove corresponding to the groove non-formed region 31. As shown in this figure, the depth of the groove 24 is not necessarily maximized just at the end of the groove 24 and can be maximized at substantial end of the groove 24. Furthermore, the shape of the 24 can be rounded. The rounded shape of the groove 24 expands a tolerance in groove forming.

The embodiment of the invention has been described with reference to examples. However, the invention is not limited to these examples. For instance, the material, shape, size, and arrangement of the substrate, laminated body, bar, and separation groove constituting the compound semiconductor device can be variously modified by those skilled in the art, and such modifications are also encompassed within the scope of the invention as long as they do not depart from the spirit of the invention.

The invention claimed is:

1. A compound semiconductor device comprising a laminated body including a crystal substrate and a compound semiconductor multilayer film,
the laminated body having a major surface, a first side face, a second side face, a third side face, and a fourth side face,
the first and the second side faces being opposed to each other, the first and the second side faces being substantially perpendicular to the major surface of the laminated body, and the first and second side faces being made of cleaved surfaces,
the third and fourth side faces being perpendicular to the major surface and to the first and second side faces, the third and fourth side faces being opposed to each other, and the third and fourth side faces being made of uncleaved surfaces,
a groove being provided on the third side face, the groove extending from the major surface and having a depth varied with position as viewed from the major surface, and the groove having ends not reaching the first and second side faces,
a spacing between one end of the groove and the first side face being smaller than a spacing between the other end of the groove and the second side surface, and
the depth of the groove at the one end closer to the first side face being smaller than the depth of the groove at the other end closer to the second side face.

2. The compound semiconductor device according to claim 1, wherein the spacing between the one end of the groove and the first side face and the spacing between the other end of the groove and the second side face are not more than 20 micrometers and more than zero, respectively.

3. The compound semiconductor device according to claim 1, wherein a maximum of the depth of the groove as viewed from the major surface is twice or more a minimum of the depth of the groove.

4. The compound semiconductor device according to claim 1, wherein the depth is maximized at the other end closer to the second side face.

5. A compound semiconductor device comprising a laminated body including a crystal substrate and a multilayer film including a light emitting section made of GaN-based material,
the laminated body having a major surface, a first side face, a second side face, a third side face, and a fourth side face,
the first and second side faces being opposed to each other, the first and second side faces being substantially perpendicular to the major surface of the laminated body, the first and second side faces being made of cleaved surfaces,
the third and fourth side faces being perpendicular to the major surface and to the first and second side faces, the third and fourth side faces being opposed to each other, and the third side face and the fourth side faces being made of uncleaved surfaces,
a groove being provided on the third side face, the groove extending from the major surface and having a depth varied with position as viewed from the major surface, and the groove having ends not reaching the first and second side faces,
a spacing between one end of the groove and the first side face being smaller than a spacing between the other end of the groove and the second side surface, and
the depth of the groove at the one end closer to the first side face being smaller than the depth of the groove at the other end closer to the second side face.

6. The compound semiconductor device according to claim 5, wherein the spacing between the one end of the groove and the first side face and the spacing between the other end of the groove and the second side face are not more than 20 micrometers and more than zero, respectively.

7. The compound semiconductor device according to claim 5, wherein a maximum of the depth of the groove as viewed from the major surface is twice or more a minimum of the depth of the groove.

8. The compound semiconductor device according to claim 5, wherein the depth is maximized at the other end closer to the second side face.

9. A compound semiconductor device comprising a laminated body including a crystal substrate and a compound semiconductor multilayer film,
the laminated body having a major surface, a first side face, a second side face, a third side face, and a fourth side face,
the first and second side faces being opposed to each other, the first and second side faces being substantially perpendicular to the major surface of the laminated body, and the first and second side faces being made of cleaved surface,
the third and fourth side faces being perpendicular to the major surface and to the first and second side faces, the third and fourth side faces being opposed to each other, and the third and fourth side faces being made of uncleaved surfaces,
a groove being provided on the third side face, the groove extending from the major surface and having a depth varied with position as viewed from the major surface, and the groove having ends not reaching the first and second side faces,
a spacing between one end of the groove and the first side face being equal to or smaller than a spacing between the other end of the groove and the second side surface, and
the depth of the groove at the one end closer to the first side face being larger than the depth of the groove at the other end closer to the second side face.

10. The compound semiconductor device according to the claim 9, wherein the spacing between the one end of the groove and the first side face and the spacing between the other end of the groove and the second side face are not more than 20 micrometers and more than zero, respectively.

11. The compound semiconductor device according to claim 9, wherein a maximum of the depth of the groove as viewed from the major surface is twice or more a minimum of the depth of the groove.

12. The compound semiconductor device according to claim 9, wherein the depth is maximized at the one end closer to the first side face.

13. A compound semiconductor device comprising a laminated body including a crystal substrate and a multilayer film including a light emitting section made of GaN-based material,
the laminated body having a major surface, a first side face, a second side face, a third side face, and a fourth side face,
the first and second side faces being opposed to each other, the first and second side faces being substantially perpendicular to the major surface of the laminated body, the first and second side faces being made of cleaved surface, the third and fourth side faces being perpendicular to the major surface and to the first and second side faces, the third and fourth side faces being opposed to each other, and the third and fourth side faces being made of uncleaved surfaces, a groove being provided on the third side face, the groove extending from the major surface and having a depth varied with position as viewed from the major surface, and the groove having ends not reaching the first and second side faces, a spacing between one end of the groove and the first side face being equal to or smaller than a spacing between the other end of the groove and the second side surface, and the depth of the groove at the one end closer to the first side face being larger than the depth of the groove at the other end closer to the second side face.

14. The compound semiconductor device according to claim 13, wherein the spacing between the one end of the groove and the first side face and the spacing between the other end of the groove and the second side face are not more than 20 micrometers and more than zero, respectively.

15. The compound semiconductor device according to claim 13, wherein a maximum of the depth of the groove as viewed from the major surface is twice or more a minimum of the depth of the groove.

16. The compound semiconductor device according to claim 13, wherein the depth is maximized at the one end closer to the first side face.

* * * * *